(12) United States Patent
Lee et al.

(10) Patent No.: US 11,281,092 B2
(45) Date of Patent: Mar. 22, 2022

(54) PELLICLE FOR EXTREME ULTRAVIOLET LITHOGRAPHY AND METHOD OF MANUFACTURING THE SAME

(71) Applicant: Samsung Electronics Co., Ltd., Suwon-si (KR)

(72) Inventors: Seungwon Lee, Hwaseong-si (KR); Minsu Seol, Seoul (KR); Dongwook Lee, Suwon-si (KR); Hyeonjin Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 184 days.

(21) Appl. No.: 16/689,221

(22) Filed: Nov. 20, 2019

(65) Prior Publication Data

US 2020/0159108 A1 May 21, 2020

(30) Foreign Application Priority Data

Nov. 20, 2018 (KR) .................. 10-2018-0143902

(51) Int. Cl.
*G03F 1/62* (2012.01)

(52) U.S. Cl.
CPC ..................... *G03F 1/62* (2013.01)

(58) Field of Classification Search
CPC ..................... G03F 1/62; G03F 1/64
USPC ............................................. 430/5
See application file for complete search history.

(56) References Cited

U.S. PATENT DOCUMENTS

| | | | |
|---|---|---|---|
| 8,518,612 B2 | 8/2013 | Akiyama et al. | |
| 9,519,220 B2 | 12/2016 | Lee et al. | |
| 9,703,187 B2 | 7/2017 | Ono et al. | |
| 10,108,084 B2 | 10/2018 | Ono et al. | |
| 10,866,507 B2 * | 12/2020 | Moon .................. | G03F 1/22 |
| 2016/0363857 A1 | 12/2016 | Shih et al. | |
| 2017/0110535 A1 | 4/2017 | Yilmaz | |
| 2018/0046071 A1 | 2/2018 | Kohmura et al. | |
| 2018/0088459 A1 | 3/2018 | Tseng et al. | |
| 2018/0173092 A1 | 6/2018 | Lin et al. | |
| 2018/0203345 A1 | 7/2018 | Klootwijk et al. | |

FOREIGN PATENT DOCUMENTS

| | | |
|---|---|---|
| CN | 106547166 A | 3/2017 |
| JP | 2010-256434 A | 11/2010 |
| KR | 10-2016-0019755 A | 2/2016 |
| KR | 10-1624078 B1 | 5/2016 |
| KR | 10-2018-0030673 A | 3/2018 |
| KR | 10-1951566 B1 | 2/2019 |
| WO | WO-2014/188710 A1 | 11/2014 |
| WO | WO-2015/045414 A1 | 4/2015 |
| WO | WO-2015/178250 A1 | 11/2015 |
| WO | WO-2016/175019 A1 | 11/2016 |

OTHER PUBLICATIONS

Dario Goldfarb "Fabrication of a full-size EUV pellicle based on silicon nitride," Proceedings of SPIE, 9635, Photomask Technology, pp. 1-14 (2015).
Carmer Zoldesi, et al. "Progressin EUV pellicle development," Proceedings of SPIE, 9048, Extreme Ultraviolet Lithography, pp. 1-11 (2014).
Dario L. Goldfarb "Fabrication of a full-size EUV pellicle based on silicon nitride," Proceedings of SPIE, 9635, Photomask Technology, pp. 1-14 (2015).
Emily E. Gallagher, et al. "Properties and performance of EUVL pellicle membranes," Proceedings of SPIE, 9635, pp. 1-9 (2015).
Jae Uk Lee, et al. "Introducing the EUV CNT pellicle," Proceedings of SPIE, 9985, pp. 1-9 (2016).
Mun Ja Kim, et al. "Study of nanometer-thick graphite film for high-power EUVL pellicle," Proceedings of SPIE, 9776, pp. 1-11 (2016).
P.J. van Zwol, et al. "Pellicle films supporting the ramp to HVM with EUV," Proceedings of SPIE, 10451, pp. 1-10 (2017).

* cited by examiner

*Primary Examiner* — Christopher G Young

(74) *Attorney, Agent, or Firm* — Harness, Dickey & Pierce, P.L.C.

(57) ABSTRACT

A pellicle for extreme ultraviolet lithography and a method of manufacturing the pellicle for extreme ultraviolet lithography are provided. The pellicle for extreme ultraviolet lithography includes a pellicle layer having a specific (or, alternatively, predetermined) thickness, a frame on an edge area of the pellicle layer and supporting the pellicle layer, and a boron implantation layer located between the pellicle layer and the frame. The boron implantation layer is spaced by a specific (or, alternatively, predetermined) distance inward from an outer periphery of the pellicle layer.

20 Claims, 9 Drawing Sheets

PELLICLE FOR EXTREME ULTRAVIOLET LITHOGRAPHY AND METHOD OF MANUFACTURING THE SAME

CROSS-REFERENCE TO RELATED APPLICATION

This application claims the benefit of Korean Patent Application No. 10-2018-0143902, filed on Nov. 20, 2018, in the Korean Intellectual Property Office, the disclosure of which is incorporated herein in its entirety by reference.

BACKGROUND

Example embodiments relate to pellicles used for mask protection in extreme ultraviolet lithography processes and/or methods of manufacturing the pellicles.

Extreme ultraviolet (EUV) lithography processes use reflective optical systems and reflective masks. A pellicle is used to prevent, or reduce the impact of, contamination of the reflective mask. The pellicle is mounted to cover one surface of the reflective mask, thereby preventing contaminants such as particles from forming on the surface of the reflective mask. This may help in, for example, defocusing the particles during the EUV lithography processes.

The pellicle includes a frame mounted on the reflective mask, and a pellicle layer located at a specific (or, alternatively, predetermined) distance from the reflective mask to prevent contaminants from forming on the reflective mask. The frame may be mainly a silicon wafer, and exposes the pellicle layer by bottom etching of the frame.

The bottom etching may be mainly performed by wet etching, and the edge of an etching area of the frame may be etched faster than the central area of the etching area of the frame during the wet etching. Accordingly, the edge of the etching area of the pellicle layer may be exposed first and the pellicle layer on the edge may be excessively etched when the pellicle layer of the central area is exposed.

As a result, the uniformity of the thickness of the pellicle layer may be deteriorated, and thus, an image may be distorted during exposure and/or a pellicle manufacturing yield may be reduced.

SUMMARY

Provided are pellicles for extreme ultraviolet lithography, each of the pellicles including a pellicle layer having a uniform thickness, and/or methods of manufacturing the pellicles.

Additional aspects will be set forth in part in the description which follows and, in part, will be apparent from the description, or may be learned by practice of the presented embodiments.

According to some example embodiments, a pellicle for extreme ultraviolet lithography includes a pellicle layer having a specific (or, alternatively, predetermined) thickness; a frame on an edge area of the pellicle layer to support the pellicle layer; and a boron implantation layer located between the pellicle layer and the frame.

The pellicle layer may include silicon nitride, graphene, silicon carbide, or boron carbide.

The boron implantation layer may include boron at a concentration of about $10^{19}/cm^3$ to about $10^{20}/cm^3$.

A thickness of the boron implantation layer may be about 1 μm to about 5 μm.

The boron implantation layer may be spaced by a specific (or, alternatively, predetermined) distance inward from an outer periphery of the pellicle layer.

The boron implantation layer may have an annular shape.

The frame and the boron implantation layer may include silicon respectively.

According to some example embodiments, a method of manufacturing a pellicle for extreme ultraviolet lithography includes forming a boron implantation layer by implanting boron to a specific (or, alternatively, predetermined) thickness on a first surface of a substrate; forming a membrane layer on a surface of the substrate; exposing the boron implantation layer by etching the substrate from a second surface of the substrate facing the first surface of the substrate; and removing an exposed portion of the boron implantation layer.

The forming of the membrane layer may include forming a protective layer on the first surface of the substrate to cover the membrane layer.

The forming of the boron implantation layer may include forming a photoresist on an edge area of the first surface of the substrate; and forming the boron implantation layer in a central area of the first surface of the substrate exposed to the photoresist.

The exposing of the boron implantation layer may include turning the substrate upside down such that the protective layer faces downward; forming a photoresist pattern on the second surface of the substrate to define a pellicle layer area and a trench area surrounding the pellicle layer area; forming a mask exposing the pellicle layer area and the trench area by removing the membrane layer exposed to the photoresist pattern; and etching the second surface of the substrate by using the mask to expose the boron implantation layer.

The exposing of the boron implantation layer may further include etching the trench area of the second surface of the substrate, exposed to the mask, to form a trench; and etching a portion of the membrane layer on the first surface of the substrate exposed to the trench.

The method may further include detaching a portion of the substrate outside the trench from a portion of the substrate inside the trench by using the trench.

The forming of the boron implantation layer may include forming the boron implantation layer to be spaced by a specific (or, alternatively, predetermined) distance inward from the trench.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
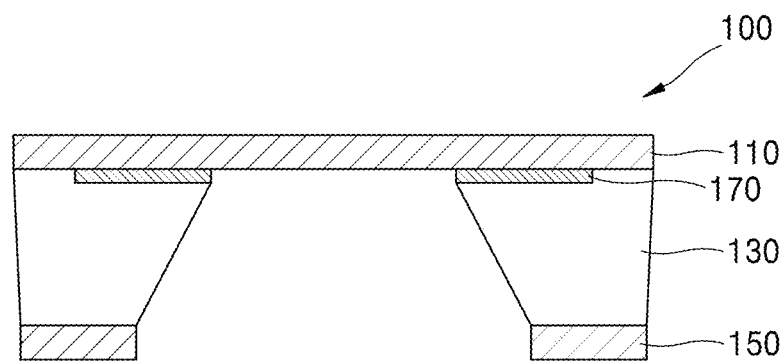
FIG. 1 is a cross-sectional view of the structure of a pellicle for extreme ultraviolet lithography according to an embodiment.

Reference will now be made in detail to some example embodiments, examples of which are illustrated in the accompanying drawings. In the drawings, thicknesses of layers and regions are exaggerated for clarity of the specification. In this regard, example embodiments may have different forms and should not be construed as being limited to the descriptions set forth herein. The embodiments of inventive concepts are capable of various modifications and may be embodied in many different forms. As used herein, the term "and/or" includes any and all combinations of one or more of the associated listed items.

It will be understood that when an element or layer is referred to as being "on" or "above" another element or layer, the element or layer may be directly on another element or layer or intervening elements or layers.

As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

The use of the terms "a" and "an" and "the" and similar referents in the context of describing inventive concepts (especially in the context of the following claims) are to be construed to cover both the singular and the plural.

Also, the steps of all methods described herein can be performed in any suitable order unless otherwise indicated herein or otherwise clearly contradicted by context. Inventive concepts are not limited to the described order of the steps. The use of any and all examples, or exemplary language (e.g., "such as") provided herein, is intended merely to better illuminate inventive concepts and does not pose a limitation on the scope of inventive concepts unless otherwise claimed.

FIG. 1 is a cross-sectional view of the structure of a pellicle 100 for extreme ultraviolet lithography according to an embodiment.

Referring to FIG. 1, the pellicle 100 for extreme ultraviolet lithography includes a pellicle layer 110 and a frame 130 for supporting the pellicle layer 110. A mask 150 may be attached to the bottom of the frame 130. The mask 150 may be used during the manufacturing process of the pellicle 100. A boron implantation layer 170 having an annular shape may be located between the pellicle layer 110 and the frame 130. The boron layer may be implanted with boron ions.

The pellicle layer 110 in implantation layer 170 may include at least one of silicon nitride, graphene, silicon carbide, or boron carbide ($B_4C$). The thickness of the pellicle layer 110 may be several tens nm, for example, about 20 nm to about 40 nm. The pellicle layer 110 may include a single layer including a single material or include multiple layers including a plurality of materials. A pellicle layer 110 including multiple layers may be or include a 10 nm SiN/20 nm nano-crystal graphene/10 nm SiN layer; however, inventive concepts are not limited thereto.

The frame 130 may include silicon. The frame 130 may be obtained by etching a silicon wafer. For example, the frame 130 may be obtained by etching an 8-inch, or 200-mm diameter, wafer; however, example embodiments are not limited thereto, and the frame 130 may be obtained by etching a 12-inch, or 300-mm diameter, wafer. The frame 130 may have a thickness, e.g. a height, of approximately 725 μm.

The boron implantation layer 170 may be an area in which boron is implanted into the frame 130. The thickness of the boron implantation layer 170 may be about 1 μm to about 5 μm. When the thickness of the boron implantation layer 170 is less than 1 μm, boron may be precipitated during a heat treatment process of the manufacturing process. Precipitated boron may act as a defect. When the thickness of the boron implantation layer 170 is greater than 5 μm, an etching time for removing a portion of the boron implantation layer 170 during the manufacturing process may increase. The boron implantation layer 170 may be an area implanted with boron ions at a concentration of about $10^{19}$ atoms/cm$^3$ to about $10^{20}$ atoms/cm$^3$ on the surface of the frame 130. When the boron ion concentration is in the range of about $10^{19}$ atoms/cm$^3$ to about $10^{20}$ atoms/cm$^3$, a silicon etching rate may sharply drop. The boron implantation layer 170 may have a rectangular, or an annular shape. The boron implantation layer 170 may be spaced by a specific (or, alternatively, predetermined) distance inward from the outer periphery of the pellicle layer 110.

The pellicle layer 110 covers a reflective mask (not shown) of extreme ultraviolet lithography. The pellicle layer 110 is spaced by a specific (or, alternatively, predetermined) distance from the reflective mask by the frame 130 and the mask 150. Extreme ultraviolet rays passing through the pellicle layer 110 transfer the shape of the reflective mask onto a substrate (not shown).

The boron implantation layer 170 may be used as an etch stop layer in the manufacturing process of the pellicle layer 110, according to example embodiments.

Since the boron implantation layer 170 is used as an etch stop layer in the manufacturing process of the pellicle layer 110 for extreme ultraviolet lithography according to example embodiments, the thickness of the pellicle layer 110 may be uniform or more uniform, and thus the production yield of the pellicle layer 110 may be improved. The pellicle layer 110 having a uniform thickness prevents, or reduces the likelihood of, image distortion during exposure.

Hereinafter, a method of manufacturing the pellicle layer 110 according to some example embodiments is described. FIGS. 2 to 11 are cross-sectional views illustrating a method of manufacturing the pellicle 110, according to some example embodiments.

Figure 2:
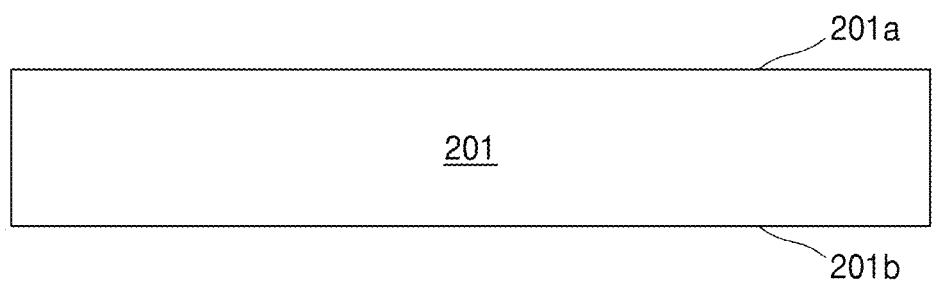
FIGS. 2 to 11 are cross-sectional views illustrating a method of manufacturing a pellicle for extreme ultraviolet lithography, according to an embodiment.

Referring to FIG. 2, a substrate 201 is provided. The substrate 201 may include silicon. The substrate 201 may be a silicon wafer. The embodiment is not limited thereto. The substrate 201 may be circular or rectangular. The shape of the substrate 201 is not limited. The diameter of the substrate 201 may be approximately 200 mm. For example, the substrate 201 may be or include an 8-inch wafer; however, example embodiments are not limited thereto. For example, the substrate 201 may be or include a 12-inch wafer having a diameter of 300 mm. The substrate 201 may have a thickness of about 725 μm; however, example embodiments are not limited thereto. The substrate 201 may have, for example, a thickness of about 300 μm to about 1000 μm. The substrate 201 includes a first surface 201a and a second surface 201b, which face each other. The first surface 201a and the second surface 201b are substantially flat surfaces.

Figure 3:
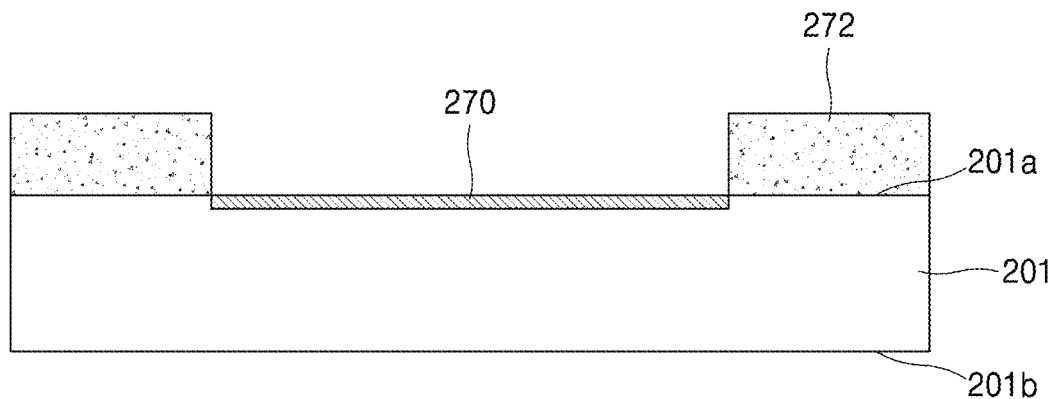

Referring to FIG. 3, a boron implantation layer 270 is formed by implanting boron ions to a specific (or, alternatively, predetermined) thickness on the first surface 201a of the substrate 201. B, $B_2H_6$, $BF_2$, or $BF_3$ may be used as a boron source; however, inventive concepts are not limited thereto. The boron implantation layer 270 may be formed with a beamline implantation tool and/or a plasma assisted doping (PLAD) implantation tool; however, inventive concepts are not limited thereto. The thickness of the boron implantation may be determined by an energy associated with the implantation process. The boron implantation layer 270 may be implanted with boron ions at a concentration of about $10^{19}/cm^3$ to about $10^{20}/cm^3$. When the boron ion concentration is in the range of about $10^{19}/cm^3$ to about $10^{20}/cm^3$, a silicon etching rate may sharply drop. The boron implantation layer 270 may serve as an etch stop layer. For example, the boron implantation layer 270 may be a layer having a wet etching rate that is less than that of silicon. The thickness of the boron implantation layer 270 may be about 1 μm to about 5 μm. When the thickness of the boron implantation layer 270 is less than 1 μm, boron may be precipitated in a subsequent heat treatment process. Precipitated boron acts as a defect. When the thickness of the boron implantation layer 270 is greater than 5 μm, an etching time required to remove the boron implantation layer 270 may increase.

The boron implantation layer 270 may be implanted with boron ions only in a portion of the first surface 201a. For example, boron ions may be implanted only in a central area of the first surface 201a and may not be implanted in an edge area of the first surface 201a. To this end, a photoresist layer 272 may be formed on the first surface 201a of the substrate 201 to partially expose the boron implantation layer 270. The photoresist layer 272 may mask the implantation of boron ions into certain areas of the substrate 201. Thereafter, the photoresist layer 272 is removed.

Figure 4:
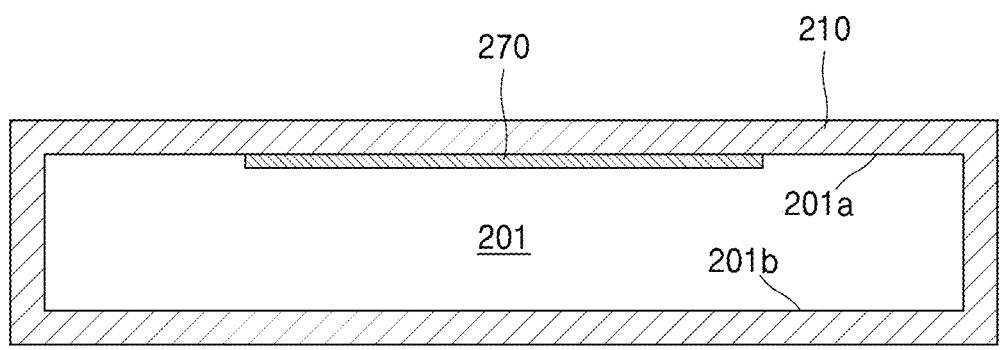

Referring to FIG. 4, a membrane layer 210 may be formed on the substrate 201 to cover the boron implantation layer 270. The membrane layer 210 may be formed, for example, by low pressure chemical vapor deposition (LPCVD). The membrane layer 210 may be formed in a furnace. However, example embodiments are not limited thereto. For example, the membrane layer 210 may be formed by a sputtering method. The membrane layer 210 may cover the first surface 201a of the substrate 201 and/or the second surface 201b facing the first surface 201a. The membrane layer 210 may be formed to cover all exposed surfaces of the substrate 201. Although FIG. 4 illustrates an example in which the membrane layer 210 covers the entire surface of the substrate 201, example embodiments is not limited thereto. For example, the membrane layer 210 may cover only the first surface 201a and/or the second surface 201b of the substrate 201. For example, if the membrane layer 210 is formed with a sputtering process, the membrane layer 210 may be formed only on the first surface 201a of the substrate 201

The membrane layer 210 may have a thickness such that the transmittance of extreme ultraviolet radiation is 50% or more. In some example embodiments, the membrane layer 210 may have a thickness of several tens of nanometers. For example, the membrane layer 210 may have a thickness of about 20 nm to about 40 nm. The membrane layer 210 may include at least one of silicon nitride, graphene, silicon carbide, or boron carbide ($B_4C$). The silicon nitride may be deposited by LPCVD, and thus graphene, the silicon carbide, and the boron carbide ($B_4C$) may be deposited by plasma-enhanced CVD (PECVD).

Figure 5:
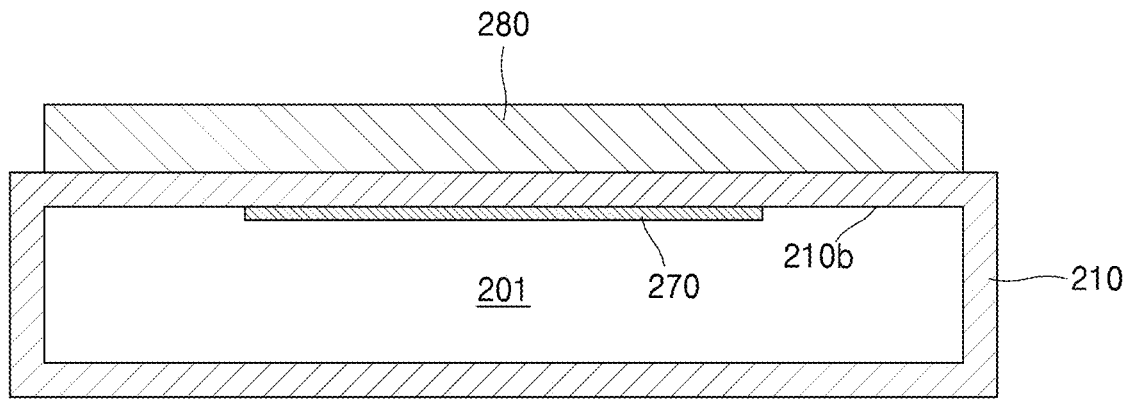

Referring to FIG. 5, a protective layer 280 may be formed on the first surface 201a of the substrate 201. The protective layer 280 may be formed by using a CVD method, e.g. a PECVD method, to have a thickness of about 50 μm to about 200 μm. The protective layer 280 is intended to protect a portion used as the pellicle layer 110 in the process described below.

Next, a first mask (see 211 in FIG. 8) and a second mask (see 212 in FIG. 8) are formed by patterning the membrane layer 210 on the second surface 201b of the substrate 201. The first mask 211 is used to form the pellicle layer (see 215 in FIG. 10) and the second mask 212 is used to remove the remaining materials from a pellicle (see 200 in FIG. 10).

Figure 6:
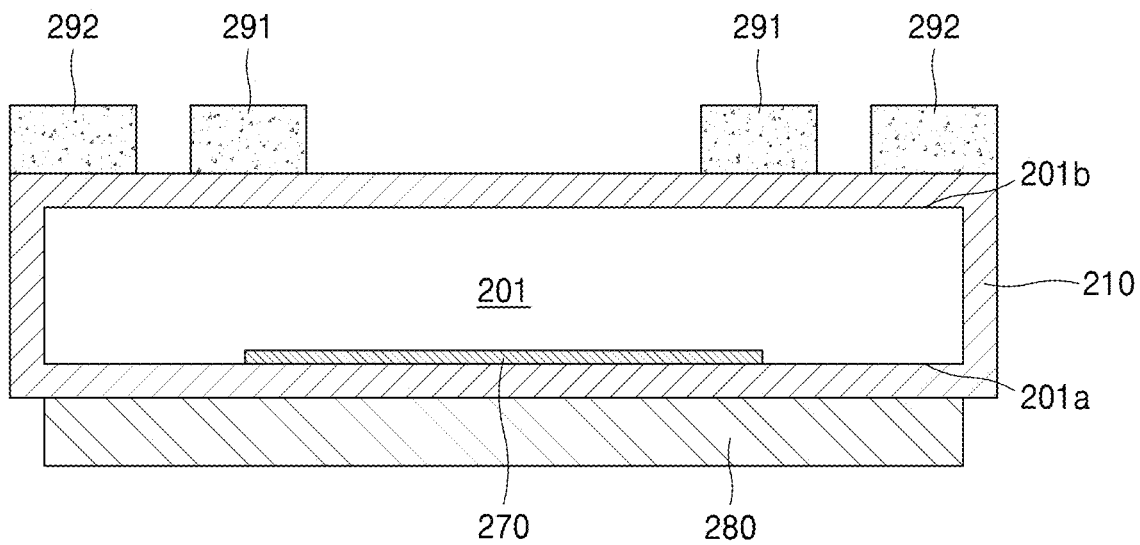

Referring to FIG. 6, the substrate 201 may be turned upside down such that the protective layer 280 faces downward. A first photoresist pattern 291 having substantially the same shape as the first mask 211 and a second photoresist pattern 292 having substantially the same shape of a portion of the second mask 212 on the second surface 201b of the substrate 201 are formed on the second surface 201b of the substrate 201.

Figure 7:
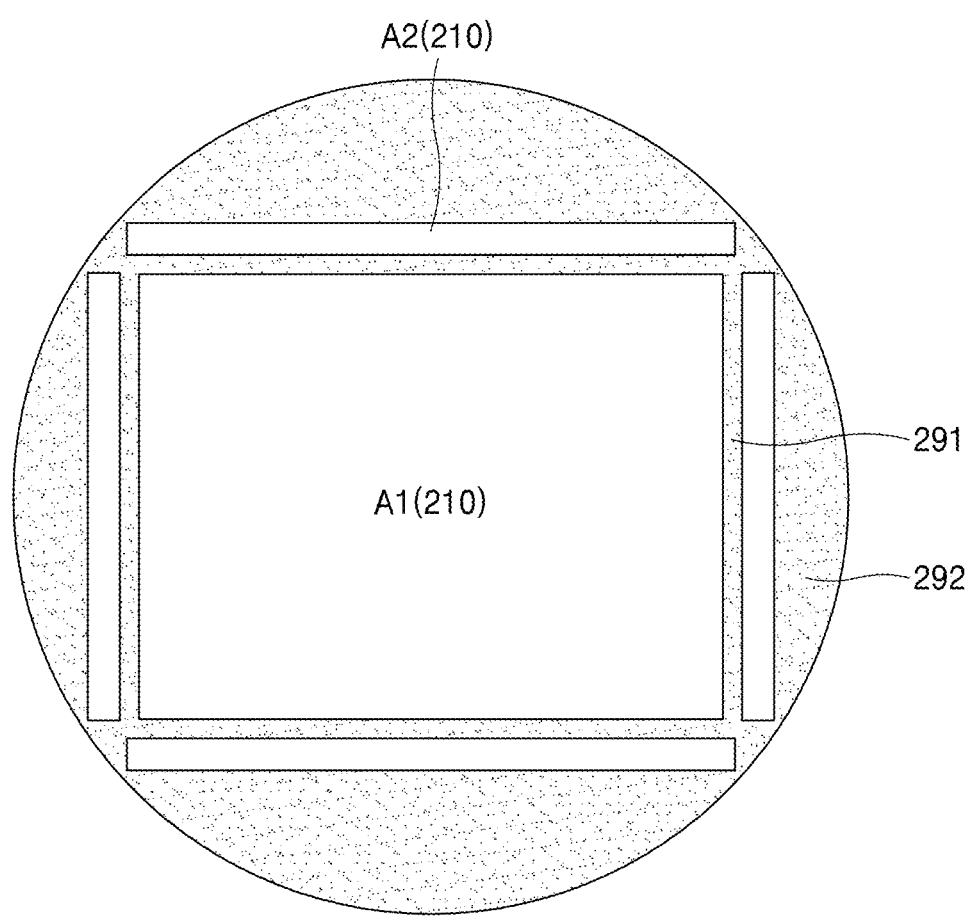

FIG. 7 is a plan view showing the second surface 201b of the substrate 201. Referring to FIG. 7, the first photoresist pattern 291 having a rectangular shape is formed on the second surface 201b of the substrate 201 and the second photoresist pattern 292 surrounding the first photoresist pattern 291 is formed. The first photoresist pattern 291 exposes a first area A1 of the membrane layer 210. The first photoresist pattern 291 and the second photoresist pattern 292 expose a second area A2 therebetween. The first photoresist pattern 291 and the second photoresist pattern 292 may be one photoresist pattern and are separately shown in FIG. 6 for convenience. The second area A2 may be or include four areas surrounding the first area A1. The first photoresist pattern 291 and the second photoresist pattern 292 may be connected to each other in some areas. The second area A2 may be one rectangular annular area. The first area A1 may be referred to as a pellicle layer area, and the second area A2 may be referred to as a trench area.

Figure 8:
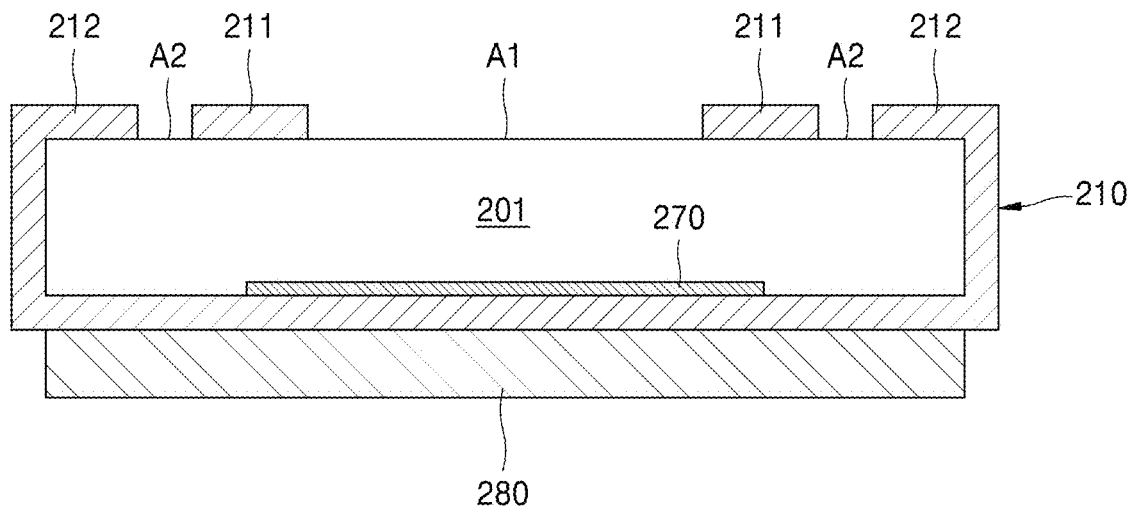

Referring to FIG. 8, the first area A1 and the second area A2 of the membrane layer 210, exposed to the first photoresist pattern 291 and the second photoresist pattern 292 on the second surface 201b, are selectively removed, e.g. selectively removed by dry etching such as with a reactive ion etching process. The dry etching may be anisotropic, or have less isotropy than that of a wet etching process. The first mask 211 and the second mask 212 are formed on the second surface 201b of the substrate 201. The shape of the first mask 211 is substantially the same as that of the first photoresist pattern 291 in FIG. 7. The first mask 211 and the second mask 212 may be one mask and are separately shown in FIG. 8 for convenience.

Figure 9:
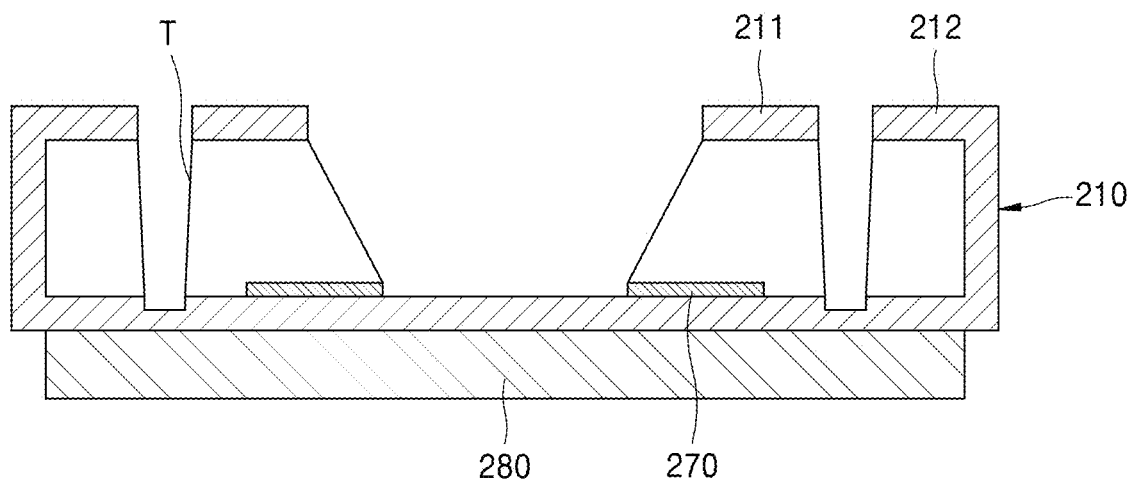

Referring to FIG. 9, the substrate 201 is wet-etched using the first mask 211 and the second mask 212. The wet etching process may be isotropic, or have more isotropy than that of the dry etching process. An etchant may include potassium hydroxide (KOH) and/or tetramethylammonium hydroxide (TMAH). The substrate 201 exposed to the first mask 211 and the second mask 212 may be removed in the wet etching process. For example, the substrate including silicon may be removed with KOH and/or TMAH. The wet etching process may be performed in two steps. In a first step, the substrate 201 in an area exposed to the first mask 211 and the second mask 212 may be removed. Although a central area of the substrate 201 is slightly left after an edge area of the substrate 201 exposed to the first mask 211 is first removed, the central area exposed to the first mask 211 may also be completely removed because the boron implantation layer 270 in the edge area serves as an etch stop layer. In a second step, the boron implantation layer 270 exposed to the first mask 211 may be removed.

In the first step, a portion of the substrate 201, exposed between the first mask 211 and the second mask 212, is etched and thus a trench T is formed. The boron implantation layer 270 may not be formed on the substrate 201 in an area exposed to the trench T. The boron implantation layer 270 may be spaced apart from the inside of the trench T by a specific (or, alternatively, predetermined) distance. In this case, in the second step, the membrane layer 210 in an area exposed to the trench T is partially etched and thinned in the process of etching the boron implantation layer 270. In the wet etching process, the protective layer 280 is removed.

Figure 10:
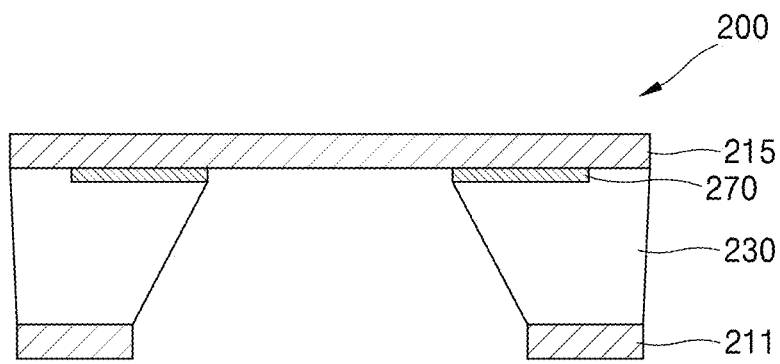

Referring to FIG. 10, when the substrate 201 outside the trench T is detached from the substrate 201 inside the trench T, the pellicle 200 is completed. The structure of the pellicle 200 may be substantially the same as the structure of the pellicle 100 of FIG. 1. In the second step, the thickness of the membrane layer 210 exposed to the trench T is reduced and thus the pellicle 200 is easily separated from other structures. The pellicle 200 includes a pellicle layer 215, a frame 230 formed at the edges of the pellicle layer 215 and supporting the pellicle layer 215, and a boron implantation layer 270 between the pellicle layer 215 and the frame 230. The boron implantation layer 270 may be spaced by a specific (or, alternatively, predetermined) distance from the outer periphery of the pellicle layer 215.

Figure 11:
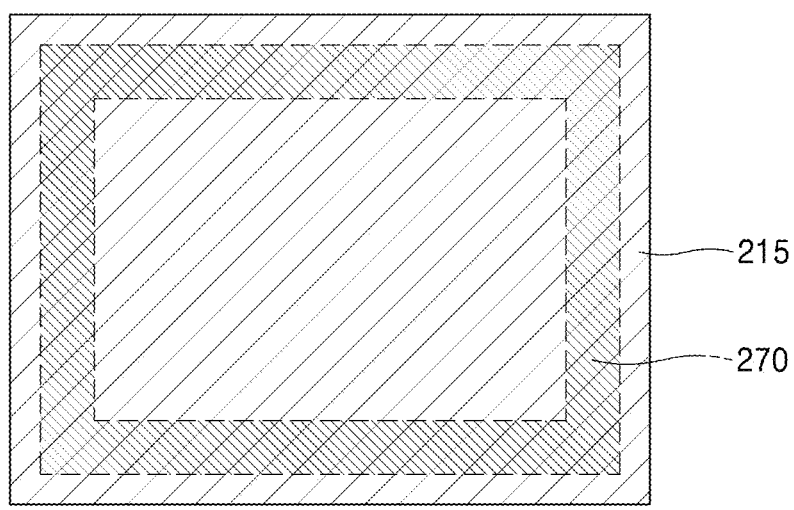

FIG. 11 is a plan view showing the shape of the boron implantation layer 270. The boron implantation layer 270 may have a rectangular annular shape.

Figure 12:
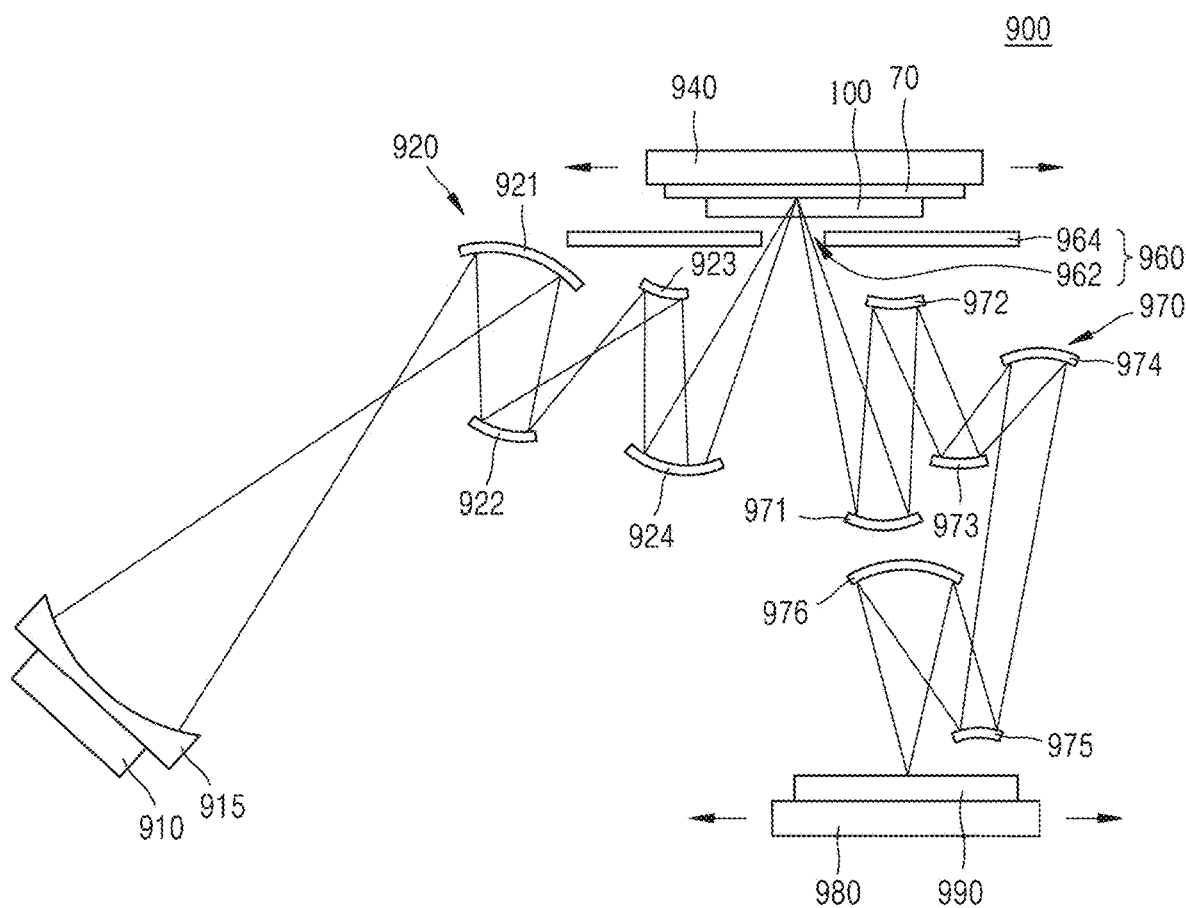
FIG. 12 is a conceptual view illustrating a reflection-type photolithography process performed by using a reticle to which a pellicle according to an example embodiment is attached.

FIG. 12 is a conceptual view illustrating performing a reflection-type photolithography process by using a reticle 70 that has the pellicle 100 attached thereon.

Referring to FIG. 12, the method of performing a reflection-type photolithography process by using the reticle 70 that has the pellicle 100 attached thereon may include mounting the reticle 70 that has the pellicle 100 attached thereon on a reticle stage 940 of a reflection-type photolithography system 900 such that the reticle 70 faces down from the reticle stage 940, wherein the reflection-type photolithography system 900 includes a light source 910, an illumination mirror system 920, the reticle stage 940, a blinder 960, a projection mirror system 970, and a wafer stage 980.

The light source 910 may generate extreme ultraviolet light (EUVL). For example, the light source 910 may generate light having a wavelength of extreme ultraviolet light, for example, about 13.5 nm by using carbon plasma. The light source 910 may include a light collector 915. The light collector 915 may collect the EUVL generated from the light source 910 and control the EUVL to be forwarded straight in one direction. For example, the EUVL generated from the light source 910 may pass the light collector 915 and then irradiated to the illumination mirror system 920.

The illumination mirror system 920 may include a plurality of illumination mirrors 921 to 924. For example, the illumination mirrors 921 to 924 may condense the EUVL to reduce losing the light off a mirrored irradiation pathway. Also, the illumination mirrors 921 to 924 may, for example, control the overall intensity distribution to be even. Thus, the plurality of illumination mirrors 921 to 924 may each include a concave mirror and/or a convex mirror to vary pathways of the EUVL. Also, the illumination mirror system 920 may mold the EUVL into a square shape, a circular shape, or a bar shape and transmit the EUVL to the reticle stage 940.

The reticle stage 940 may equip the reticle 70 on a lower surface and move in a horizontal direction. For example, the reticle stage 940 may move in directions indicated by arrows. The reticle stage 940 may include an electrostatic chuck (ESC). The reticle 70 may include optical patterns in one surface thereof. The reticle 70 may be equipped on the lower surface of the reticle stage 940 such that the surface having the optical patterns faces down in the drawing.

The blinder 960 may be under the reticle stage 940. The blinder 960 may include a slit 962 and a plate 964. The slit 962 may have an aperture shape. The slit 962 may mold a shape of the EUVL that is transmitted from the illumination mirror system 920 to the reticle 70 on the reticle stage 940. The EUVL transmitted from the illumination mirror system 920 passes through the slit 962 and may be irradiated to the reticle on the reticle stage 940. The EUVL reflected from the reticle 70 on the reticle stage 940 may pass through the slit 962 and transmitted to the projection mirror system 970. The plate 964 may block the EUVL irradiated on a region other than the slit 962. Thus, the blinder 960 may allow a part of the EUVL to pass through the slit 962 and may use the plate 964 to block a part of the EUVL. Also, the EUVL reflected from the reticle 70 equipped on the lower surface of the reticle stage 940 may pass through the slit 962.

The projection mirror system 970 may be receive the EUVL that is reflected from the reticle 70 and passed through the slit 962 and transmit the EUVL to a wafer 990. The projection mirror system 970 may also include a plurality of projection mirrors 971 to 976. The EUVL irradiated on the wafer 990 by the projection mirrors 971 to 976 may include virtual aerial image information of the optical patterns of the reticle 70. A shape of the EUVL irradiated on the wafer 990 may be the same as the shape molded by the slit 962. The plurality of projection mirrors 971 to 976 may correct various aberrations.

The wafer stage 980 may settle the wafer 990 and move the wafer 990 in horizontal directions. For example, the wafer 990 may move in directions indicated by arrows. The wafer stage 980 may simultaneously move in the same direction with a direction the reticle stage 940 moves at a constant ratio. For example, when a moving ratio is 10:1 (10%), in the case of the reticle stage 940 moving 10 μm to the left or to the right, the wafer stage 980 may move 1 μm in the same direction. Also, when a moving ratio is 5:1 (20%), in the case the reticle stage 940 moving 10 μm to the left or to the right, and the wafer stage 980 may move 2 μm in the same direction. The moving ratio may be set variously. For example, the wafer stage 980 may move in a step-and-scan manner. A focus of the EUVL irradiated from the projection mirror system 970 may be on a surface of the wafer 990. For example, a photoresist layer having a constant thickness is formed on the wafer 990, and the focus of the EUVL may be in the photoresist layer.

Figure 13:
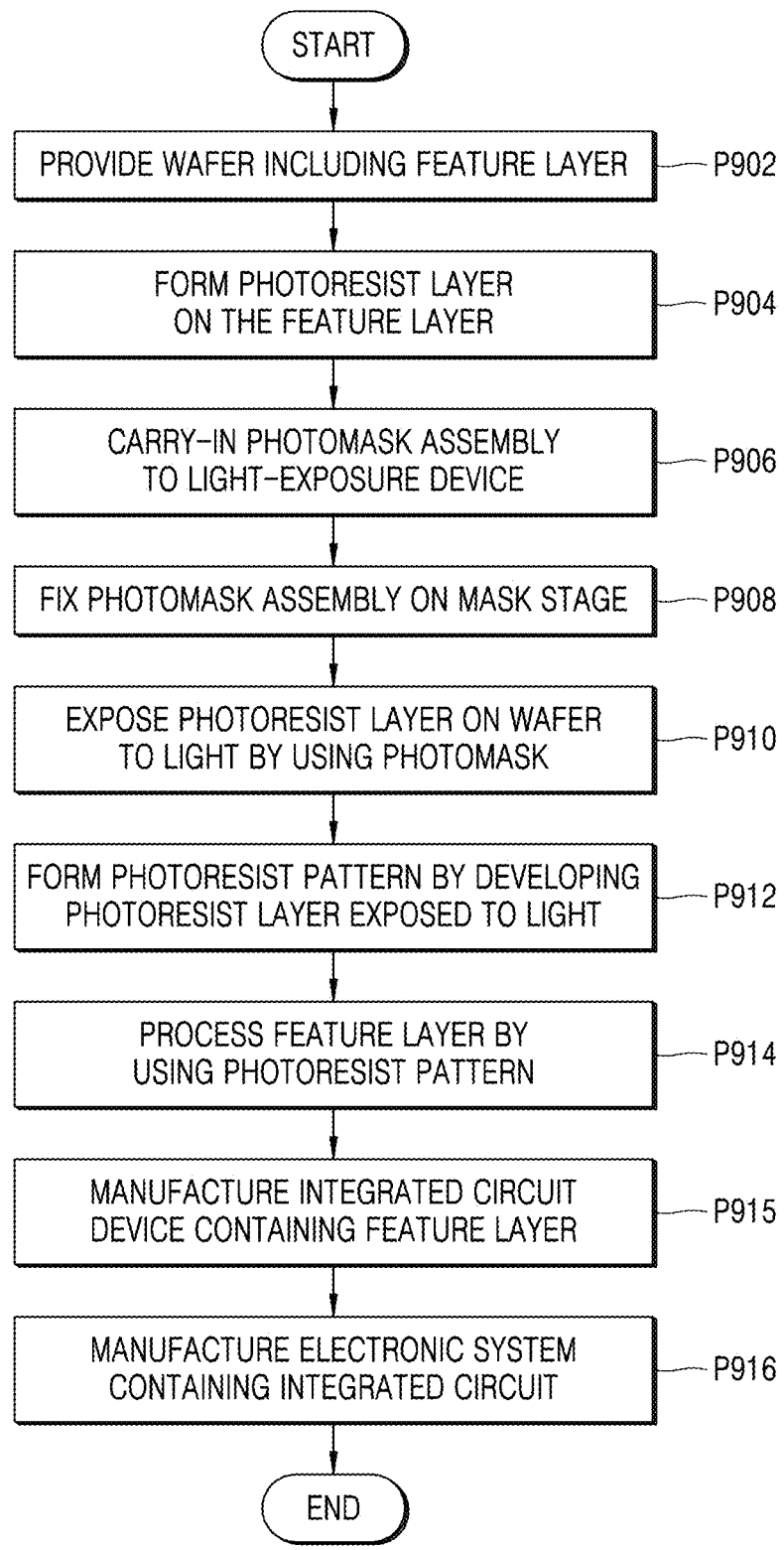
FIG. 13 is a flowchart illustrating a method of manufacturing an electronic system according to example embodiments.

FIG. 13 is a flowchart illustrating a method of manufacturing an electronic system according to example embodiments.

Referring to FIG. 13, in process P902, a wafer including a feature layer is provided.

In some example embodiments, the feature layer may be or may include a conducting layer or an insulating layer formed on the wafer. For example, the feature layer may be formed of a metal, a semiconductor, or an insulating material. In other example embodiments, the feature layer may be a part of the wafer.

In process P904, a photoresist layer is formed on the feature layer. In some example embodiments, the photoresist layer may be formed of a resist material for EUV (6.75 nm or 13.5 nm). In some example embodiments, the photoresist layer may be formed of a resist for a F2 excimer laser (157 nm), a resist for an argon-fluoride (ArF) excimer laser (193 nm), and/or a resist for a krypton-fluoride (KrF) excimer laser (248 nm). The photoresist layer may be formed of a positive-type photoresist or a negative-type photoresist.

In some example embodiments, a photoresist composition including a photosensitive polymer having an acid-labile group, a potential acid, and/or a solvent may be spin-coated on the feature layer to form a photoresist layer formed of the positive-type photoresist.

In some example embodiments, the photosensitive polymer may include a (meth)acrylate-based polymer. The (meth)acrylate-based polymer may be an aliphatic (meth) acrylate-based polymer. For example, the photosensitive polymer may be polymethylmethacrylate (PMMA), poly (t-butylmethacrylate), poly(methacrylic acid), poly(norbornylmethacrylate)), a binary or ternary copolymer of repeating units of the (meth)acrylate-based polymers, or a mixture thereof. Also, these photosensitive polymers may have been substituted with various acid-labile protecting groups. The protecting groups may include a tertbutoxycarbonyl (t-BOC) group, a tetrahydropyranyl group, a trimethylsilyl group, a phenoxyethyl group, a cyclohexenyl group, a tert-butoxycarbonylmethyl group, a tert-butyl group, an adamantly group, or a norbornyl group. However, example embodiments are not limited thereto.

In some example embodiments, the potential acid may be formed of a photoacid generator (PAG), a thermoacid generator (TAG), or a combination thereof. In some example embodiments, the PAG may be formed of a material that produces an acid when exposed to light which is one selected from EUV light (13.5 nm), a F2 excimer laser (157 nm), an ArF excimer laser (193 nm), and a KrF excimer laser (248 nm). The PAG may be formed of an onium salt, a halogen compound, a nitrobenzyl ester, an alkylsulfonate, a diazonaphthoquinone, an iminosulfonate, a disulfine, a diazomethane, or a sulfonyloxyketone.

In process P906 of FIG. 13, a photomask assembly according to an example embodiment may be carried-in to a light-exposure device.

In process P908 of FIG. 13, the photomask assembly may be fixed on a mask stage.

In some example embodiments, the mask stage may be the mask stage 810 of the integrated circuit device manufacturing apparatus 800 shown in FIG. 12.

In process P910, a photoresist layer on a wafer is exposed to light by using the photomask.

In some example embodiments, light exposure may be performed by using a reflection-type light-exposure meter, but example embodiments are not limited thereto. For example, a transmission-type light-exposure meter may be used in light exposure.

In process P912, the light-exposed photoresist layer is developed to form a photoresist pattern.

In process P914, the feature layer is processed by using the photoresist pattern.

In some example embodiments, the feature layer may be etched by using the photoresist pattern as an etching mask, and thus a fine feature pattern may be formed to process the feature layer according to process P914.

In other example embodiments, impurity ions may be injected to the feature layer by using the photoresist pattern as an ion injection mask to process the feature layer according to process P914. In other example embodiments, a separate process film may be formed on the feature layer which is being exposed through the photoresist pattern formed in process P912 to process the feature layer according to process P914. The process film may be formed of a conducting layer, an insulating layer, a semiconductor layer, or a combination thereof.

In process P915, an integrated circuit device containing the feature layer is manufactured.

In process P916, an electronic device containing the integrated circuit is manufactured.

Figure 14:
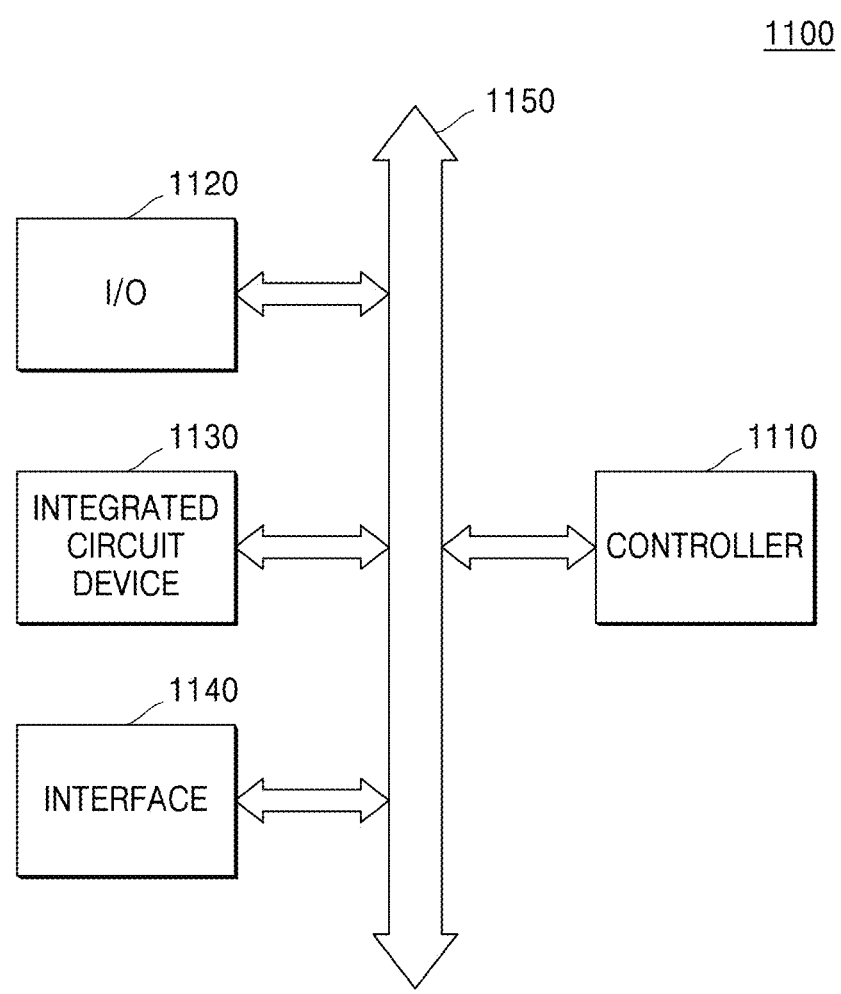
FIG. 14 is a block diagram illustrating an example of an electronic system including the integrated circuit device according to example embodiments of inventive concepts.

FIG. 14 is a block diagram illustrating an example of an electronic system including an integrated circuit device manufactured according to embodiments of the inventive concepts.

Referring to FIG. 14, an electronic system 1100 manufactured according to an embodiment of inventive concepts may include an integrated circuit device 1130, a controller 1110, an input/output (I/O) device 1120, an interface 1140, and a bus 1150.

The integrated circuit device 1130 may be an integrated circuit device manufacturing according to the process in FIG. 13.

The electronic system 1100, the I/O device 1120, the integrated circuit device 1130, and/or the interface 1140 may be connected to each other via the bus 1150. The bus 1150 corresponds to a path along which data are transmitted.

The controller 1110 may include at least one of a microprocessor, a digital signal processor, a microcontroller, and logic elements capable of performing similar functions to those of a microprocessor, a digital signal processor and a microcontroller. The I/O device 1120 may include a keypad, a keyboard, and a display device. The integrated circuit device 1130 may store data and/or commands. The interface 1140 may be used to transmit/receive data to/from a communication network. The interface 1140 may be a wired or wireless interface. In an example embodiment, the interface 1140 may include an antenna or a wired/wireless transceiver. Although not shown, the electronic system 1100 may include an operating memory for improving the operation of the controller 1110 and may further include a high-speed dynamic random access memory (DRAM) and/or SRAM.

The electronic system 1100 may be applied to all types of electronic products capable of transmitting and/or receiving information in a wireless environment, such as a personal digital assistant (PDA), a portable computer, a web tablet, a wireless phone, a mobile phone, a digital music player, and/or a memory card.

According to the method of manufacturing a pellicle for extreme ultraviolet lithography according to example embodiments, the thickness of a pellicle layer may be uniformly formed by using a boron implantation layer, and accordingly, a production yield of the pellicle layer may be improved.

Furthermore, by limiting an area where the boron implantation layer is formed to the center of a substrate, the separation between the pellicle and the substrate may be facilitated.

It should be understood that embodiments described herein should be considered in a descriptive sense only and not for purposes of limitation. Descriptions of features or aspects within each embodiment should typically be considered as available for other similar features or aspects in other embodiments.

While one or more example embodiments have been described with reference to the figures, it will be understood by those of ordinary skill in the art that various changes in form and details may be made therein without departing from the spirit and scope as defined by the following claims.

What is claimed is:

1. A pellicle for extreme ultraviolet lithography, the pellicle comprising:
   a pellicle layer having a first thickness;
   a frame on an edge area of the pellicle layer, the frame supporting the pellicle layer; and
   a boron implantation layer between the pellicle layer and the frame.

2. The pellicle of claim 1, wherein the pellicle layer includes at least one of silicon nitride, graphene, silicon carbide, or boron carbide.

3. The pellicle of claim 1, wherein the boron implantation layer comprises boron at a concentration of about $10^{19}/cm^3$ to about $10^{20}/cm^3$.

4. The pellicle of claim 1, wherein a thickness of the boron implantation layer is about 1 μm to about 5 μm.

5. The pellicle of claim 1, wherein the boron implantation layer is spaced by a first distance inward from an outer periphery of the pellicle layer.

6. The pellicle of claim 1, wherein the boron implantation layer has an annular shape.

7. The pellicle of claim 1, wherein both the frame and the boron implantation layer comprise silicon.

8. A method of manufacturing a pellicle for extreme ultraviolet lithography, the method comprising:
   forming a boron implantation layer by implanting boron to a first thickness on a first surface of a substrate;
   forming a membrane layer on the first surface of the substrate;
   exposing the boron implantation layer by etching the substrate from a second surface of the substrate, the second surface facing the first surface of the substrate; and
   removing an exposed portion of the boron implantation layer.

9. The method of claim 8, wherein the forming of the boron implantation layer comprises implanting boron at a concentration of about $10^{19}/cm^3$ to about $10^{20}/cm^3$.

10. The method of claim 8, wherein the forming of the boron implantation layer comprises forming a layer having a thickness of about 1 μm to about 5 μm.

11. The method of claim 8, wherein the membrane layer comprises at least one of silicon nitride, graphene, silicon carbide, or boron carbide.

12. The method of claim 8, wherein the forming of the membrane layer comprises forming a protective layer on the first surface of the substrate, the protective layer covering the membrane layer.

13. The method of claim 12, wherein the forming of the boron implantation layer comprises:
   forming a first photoresist pattern on an edge area of the first surface of the substrate; and
   forming the boron implantation layer in a central area of the first surface of the substrate, the central area exposed to the first photoresist pattern.

14. The method of claim 13, wherein the exposing of the boron implantation layer comprises:
   turning the substrate upside down such that the protective layer faces downward;
   forming a second photoresist pattern on the second surface of the substrate, the second photoresist pattern defining a pellicle layer area and a trench area surrounding the pellicle layer area;
   forming a mask exposing the pellicle layer area and the trench area by removing the membrane layer exposed to the second photoresist pattern; and
   etching the second surface of the substrate by using the mask to expose the boron implantation layer.

15. The method of claim 14, wherein the exposing of the boron implantation layer further comprises:
   etching the trench area of the second surface of the substrate, exposed to the mask, to form a trench; and
   etching a portion of the membrane layer on the first surface of the substrate exposed to the trench.

16. The method of claim 15, further comprising:
   detaching a portion of the substrate outside the trench from a portion of the substrate inside the trench by using the trench.

17. The method of claim 15, wherein the forming of the boron implantation layer comprises forming the boron implantation layer to be spaced by a first distance inward from the trench.

18. The method of claim 15, wherein the exposing the boron implantation layer by etching the substrate includes,
   etching the substrate by using a wet etching process.

19. The method of claim 18, wherein the etching the substrate by using a wet etching process includes,
   etching the substrate by using at least one of KOH or TMAH.

20. The method of claim 14, wherein the etching the portion of the membrane layer on the first surface of the substrate exposed to the trench includes,
   etching the portion of the membrane using a dry etching process.

* * * * *